(12) United States Patent
Korth et al.

(10) Patent No.: US 9,274,186 B2
(45) Date of Patent: Mar. 1, 2016

(54) GAS CELL SEMICONDUCTOR CHIP ASSEMBLY

(71) Applicant: The Johns Hopkins University, Baltimore, MD (US)

(72) Inventors: Haje Korth, Sykesville, MD (US); Kim Strohbehn, Ellicott City, MD (US); Andreas G. Andreou, Baltimore, MD (US); Francisco Tejada, Kingsville, MD (US)

(73) Assignee: The Johns Hopkins University, Baltimore, MD (US)

( * ) Notice: Subject to any disclaimer, the term of this patent is extended or adjusted under 35 U.S.C. 154(b) by 491 days.

(21) Appl. No.: 13/933,385

(22) Filed: Jul. 2, 2013

(65) Prior Publication Data

US 2014/0009149 A1    Jan. 9, 2014

Related U.S. Application Data

(60) Provisional application No. 61/668,498, filed on Jul. 6, 2012.

(51) Int. Cl.
*G01V 3/00* (2006.01)
*G01R 33/26* (2006.01)

(52) U.S. Cl.
CPC ..................... *G01R 33/26* (2013.01)

(58) Field of Classification Search
USPC ........................................................ 324/305
See application file for complete search history.

(56) References Cited

U.S. PATENT DOCUMENTS

| | | | | |
|---|---|---|---|---|
| 3,348,165 A | * | 10/1967 | Inouye | H03L 7/26 331/3 |
| 6,472,869 B1 | * | 10/2002 | Upschulte | G01R 33/26 324/300 |
| 6,900,702 B2 | | 5/2005 | Youngner et al. | |
| 7,064,835 B2 | | 6/2006 | Riley, Jr. et al. | |
| 7,292,031 B2 | | 11/2007 | Abbink et al. | |
| 7,359,059 B2 | | 4/2008 | Lust et al. | |
| 7,825,736 B2 | * | 11/2010 | McGuyer | G04F 5/145 331/3 |
| 7,852,163 B2 | | 12/2010 | Braun et al. | |
| 7,872,473 B2 | | 1/2011 | Kitching et al. | |
| 7,902,927 B2 | | 3/2011 | Davis et al. | |
| 8,067,991 B2 | | 11/2011 | Youngner et al. | |
| 8,212,556 B1 | * | 7/2012 | Schwindt | G01R 33/26 324/301 |
| 8,373,413 B2 | * | 2/2013 | Sugioka | G01R 33/26 324/304 |
| 2004/0140799 A1 | * | 7/2004 | Romalis | G01R 33/02 324/301 |
| 2007/0167723 A1 | | 7/2007 | Park et al. | |
| 2009/0243610 A1 | * | 10/2009 | Ichihara | G01R 33/0385 324/301 |
| 2011/0031969 A1 | | 2/2011 | Kitching et al. | |
| 2013/0082701 A1 | * | 4/2013 | Mizutani | G01R 33/323 324/301 |
| 2014/0225678 A1 | * | 8/2014 | Yano | G01R 33/26 331/94.1 |

* cited by examiner

*Primary Examiner* — Rodney Fuller
(74) *Attorney, Agent, or Firm* — Noah J. Hayward (57) ABSTRACT

A gas cell semiconductor chip assembly includes a gas cell including an alkali gas stored therein and a first semiconductor chip including a first resistive heating loop at a location corresponding to the gas cell to heat the gas cell and a second resistive heating loop around an outer perimeter of the first resistive heating loop. The second resistive heating loop is configured to cancel a magnetic field of the first resistive heating loop based on a current flowing through the first and second resistive heating loops.

19 Claims, 4 Drawing Sheets

GAS CELL SEMICONDUCTOR CHIP ASSEMBLY

CROSS-REFERENCE TO RELATED APPLICATION

This application claims priority to and the benefit of prior-filed co-pending U.S. Provisional Application No. 61/668,498, filed Jul. 6, 2012, the content of which is herein incorporated by reference in its entirety.

BACKGROUND

Example embodiments of the present invention relate to a magnetometer, and in particular to a magnetometer that detects a magnetic field by optically pumping a gas and detecting an optical modulation of the gas.

The magnetic field is a fundamental physical quantity, and its precise measurement plays a central role in addressing the scientific objectives of many planetary, solar, and interplanetary science missions, as well as the practical objectives of commercial and consumer electronics. Fluxgate magnetometers are widely used because they measure the vector magnetic field with good sensitivity and require only modest mass and power resources. Because fluxgate magnetometers measure voltages proportional to the ambient magnetic field, their scale factors and offsets must be calibrated and are subject to drift over time and temperature.

On the other hand, the measurement technique of proton-precession and optically-pumped magnetometers is based on fundamental physical quantities such as the magnetic moment and spin angular momentum of the electrons and atomic nuclei. While the operating principle of proton-precession magnetometers is based on nuclear magnetic resonance, optically-pumped magnetometers are based on the precession of electron spins as the mechanism for magnetic field detection. Both types of atomic magnetometers have demonstrated excellent performance with respect to sensitivity, absolute accuracy, and dynamic range while providing long-term absolute accuracy and stability. However, a major disadvantage of these instruments is their significant mass and high power requirements. With sensors as large as 1500 cm$^3$, these instruments can draw up to tens of Watts of power and have a typical mass of several kilograms. In addition, because the atomic resonances sensed by these instruments do not provide directional magnetic field information, vector measurement capability, which is required by most space-based scientific missions, must either be retrofitted or obtained in combination with a fluxgate magnetometer.

SUMMARY

Embodiments of the invention related to a gas cell semiconductor chip assembly that includes a gas cell having an alkali gas stored therein and a first semiconductor chip having a first resistive heating loop at a location corresponding to the gas cell to heat the gas cell and a second resistive heating loop around an outer perimeter of the first resistive heating loop. The second resistive heating loop is configured to cancel a magnetic field of the first resistive heating loop based on a current flowing through the first and second resistive heating loops.

Additional aspects of the invention relate to a gas cell sensor assembly including a light source and a light detector to detect light from the light source. A gas cell semiconductor chip assembly is located between the light source and the light detector, such that the light from the light source passes through a gas cell of the gas cell semiconductor chip assembly prior to being detected by the light detector. The gas cell semiconductor chip includes a gas cell having an alkali gas stored therein and a first semiconductor chip having a first resistive heating loop at a location corresponding to the gas cell to heat the gas cell and a second resistive heating loop around an outer perimeter of the first resistive heating loop. The second resistive heating loop is configured to cancel a magnetic field of the first resistive heating loop based on a current flowing through the first and second resistive heating loops.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of example embodiments of the as-claimed invention are apparent from the following detailed description taken in conjunction with the accompanying drawings, in which:

DETAILED DESCRIPTION

Conventional absolute magnetometers are too large or heavy for some applications, or suffer from inaccuracy due to magnetic fields that may be generated by the circuit that is intended to measure an ambient magnetic field. Embodiments of the invention relate to an alkali gas magnetometer having paired resistive heating loops and paired RF magnetic field-generating single-turn circular current loops.

Figure 1A:
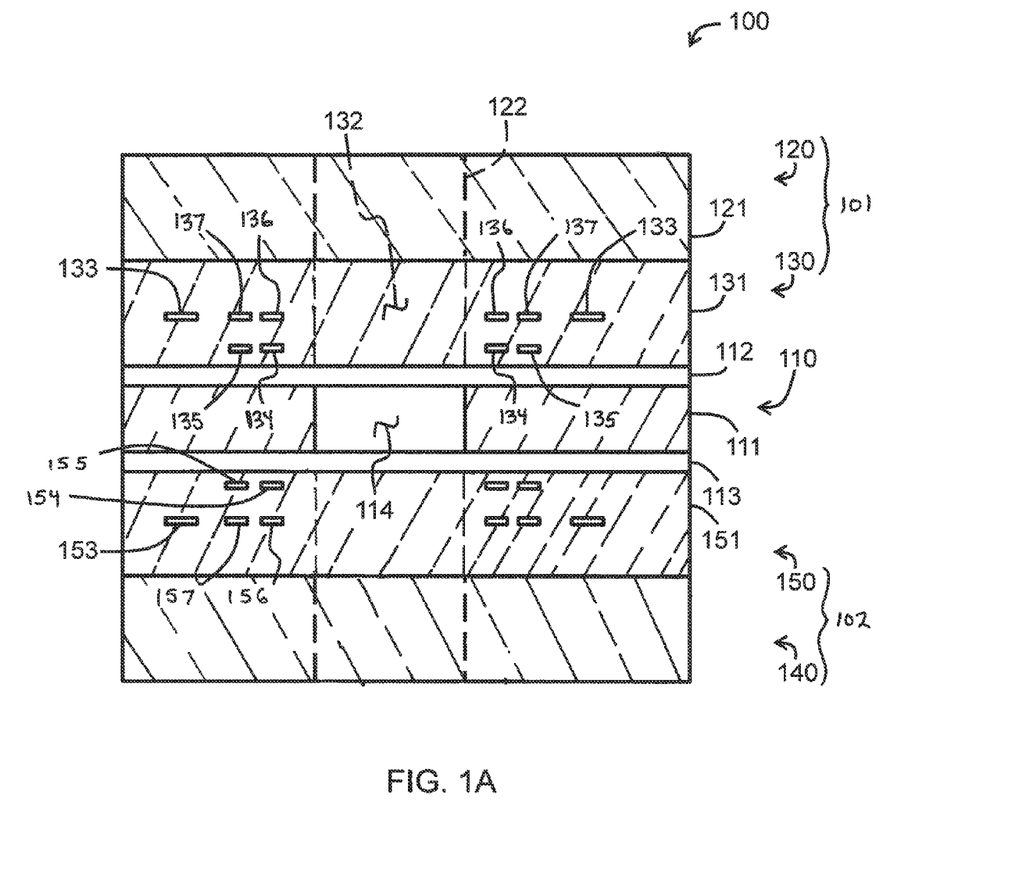
FIG. 1A is a cross-section view of a gas cell semiconductor chip assembly according to an embodiment of the invention.

FIG. 1 illustrates a side cross-section view of a gas cell semiconductor chip assembly 100 according to an embodiment of the invention. The gas cell semiconductor chip assembly 100 includes a gas cell layer 110 including a substrate 111 and a gas cell. Transparent layers 112 and 113 sandwich the substrate 111 to form the cavity 114, or gas cell 114, in which a gas is stored. In one embodiment, the transparent layers are made of glass. However, embodiments of the invention encompass any material capable of maintaining a gas in the cavity 114, passing light through the material and having semiconductor chips formed on, or mounted to, the material. The substrate 111 may be formed of silicon or any other desired material. The substrate 111 may be opaque, translucent or transparent. In one embodiment, the gas is rubidium (Rb) or another alkali metal. However, embodiments of the invention encompass any gas capable of being excited to measure a magnetic field or to generate any other desired signals.

The semiconductor chip assembly 100 includes a first semiconductor chip 101 formed on, or mounted to, the gas cell layer 110. The first semiconductor chip includes semiconductor layers 130 formed on a substrate layer 120. The substrate layer 120 is configured to pass light through the substrate layer 120. For example, in one embodiment the substrate layer 120 is transparent. In one embodiment, the substrate layer 120 is made of sapphire, and the semiconductor layers 130 are formed on the sapphire in a silicon-on-sapphire fabrication process, such as by deposition or any other method. In an alternative embodiment, the substrate 121 of the substrate layer 120 is not transparent and the substrate 121 passes light via a hole 122 formed in the substrate 121. In FIG. 1, the dashed lines defining the hole 122 demonstrate that when the substrate 121 is transparent, no hole 122 need be formed in the substrate 121.

The semiconductor layers 130 include a semiconductor material 131 and wiring 133-137. For example, the semiconductor layers 130 may include two or more wiring layers, insulating layers and any other layers. In one embodiment, the semiconductor layers 130 are transparent to light transmitted to the gas cell 114. In another embodiment, the semiconductor layers 130 pass light to the gas cell 114 via an opening 132 formed in the semiconductor material 131. In FIG. 1, the dashed lines defining the opening 132 indicate that in an embodiment in which the semiconductor material 131 is transparent, no opening 132 need be formed in the semiconductor material 131.

The wiring 133-137 includes a first resistive heater coil 134 and a second resistive heater coil 135. In the present specification, the first and second resistive heater coils 134 and 135, and any other described resistive heater coils, may also be referred to merely as "heater coils." The first and second resistive heater coils 134 and 135 may be formed along a same plane, or in a same metal layer or wiring layer of the semiconductor material 131. The first and second heater coils 134 and 135 are configured to heat the gas in the gas cell 114. The first and second heater coils 134 and 135 may be configured to surround an outside of the gas cell 114, or to have outer diameters that are outside the outer diameter of the gas cell 114. Alternatively, the gas cell 114 may have an outer diameter larger than the diameters of one or both of the first and second heater coils 134 and 135.

The first and second heater coils 134 and 135 are configured to heat the gas in the gas cell 134 by having a current run through the first and second heater coils 134 and 135, which heats the first and second heater coils 134 and 135, the semiconductor material 131 and the gas in the gas cell 114. The heater coils 134 and 135 may heat the gas to a predetermined temperature according to the type of gas. For example, in an embodiment in which rubidium is used, the heater coils 134 and 135 may heat the rubidium to around one hundred (100) degrees Celsius. In one embodiment, the first and second heater coils 134 and 135 are configured such that a magnetic field generated by running current through the first heater coil 134 cancels out the magnetic field generated by running current through the second heater coil 135.

Figure 2:
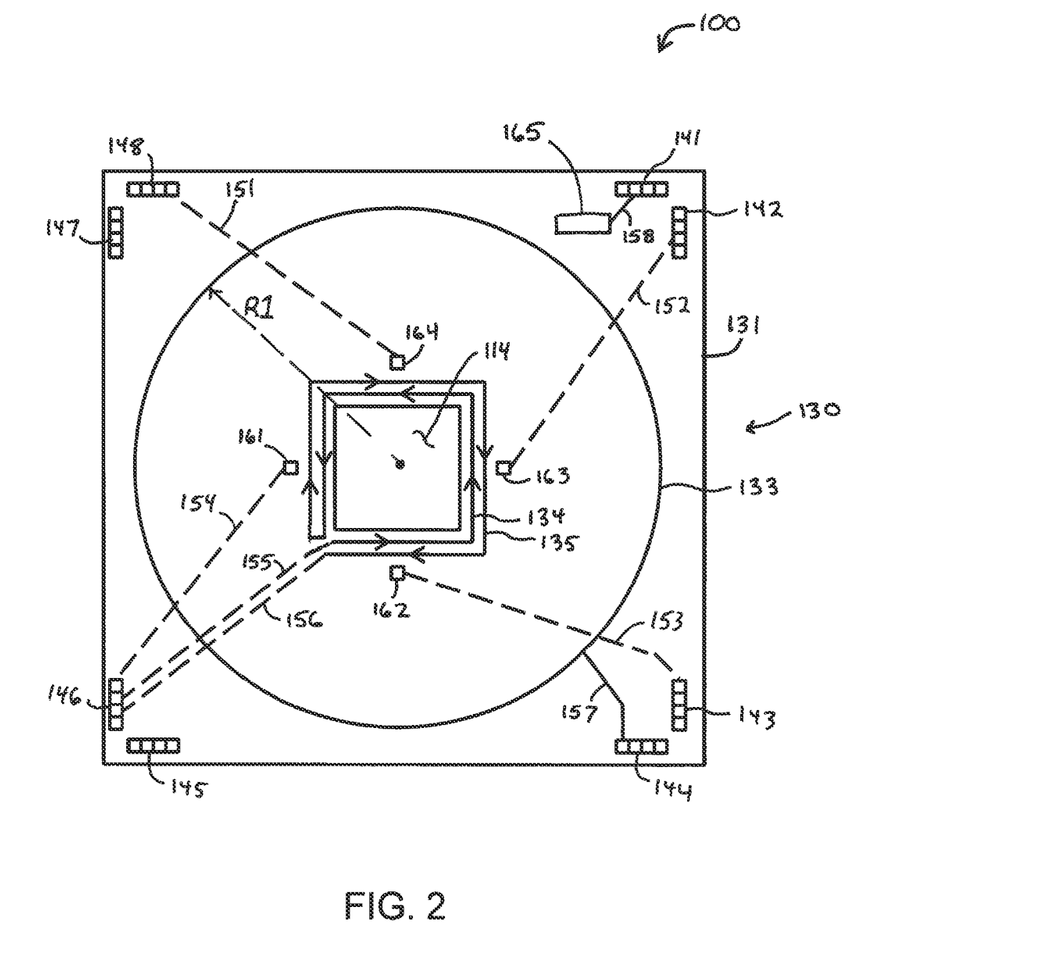
FIG. 2 is a cross-sectional view from a top of a gas cell semiconductor chip assembly according to yet another embodiment of the invention.

As illustrated in FIG. 2, the gas cell 114 may have a square shape and the first and second heater coils 134 and 135 may also have a square or rectangular shape corresponding to the shape of the gas cell 114. However, embodiments of the invention encompass heater coils having any desired shape.

Referring to FIGS. 1A and 2, the semiconductor layers 130 also include a single-turn circular current loop 133. The single-turn circular current loop 133 surrounds the gas cell 114 and the first and second heater coils 134 and 135. In one embodiment, the single-turn circular current loop 133 is formed in a same metal layer or wiring layer of the semiconductor layers 130 as the first and second heater coils 134 and 135. However, in an alternative embodiment, as illustrated in FIG. 1A, the single-turn circular current loop 133 may be formed in a different wiring layer of the semiconductor layers 130 from the first and second heater coils 134 and 135.

In operation, an alternating current is applied to the single-turn circular current loop 133 to generate a radio frequency (RF) magnetic field while the heating coils 134 and 135 heat the gas in the gas cell 114. The RF magnetic field excites the gas within the gas cell 114, which results in optical modulation of light passing through the gas at a frequency according to the level of excitement of the atoms in the gas. The modulation is affected by a magnetic field in the environment around the gas cell 114 and thus measuring the modulation may provide data regarding the magnetic field around the gas cell semiconductor chip assembly 100.

The semiconductor layers 130 may also include resistive heating coils 136 and 137. The resistive heating coils 136 and 137 may be located in the same wiring layer of the semiconductor layers 130. As illustrated in FIG. 1A, the resistive heating coils 136 and 137 may be aligned with the resistive heating coils 134 and 135. In one embodiment, the resistive heating coils 136 and 137 are configured such that the heating coil 136 generates a magnetic field to cancel the magnetic fields generated by the heating coils 134 and 137, and the heating coil 137 generates a magnetic field to cancel the magnetic fields of the heating coils 135 and 136. In particular, the resistive heating coils 136 and 137 may have a same shape as the resistive heating coils 134 and 135, but may be configured such that a current runs through the resistive heating coils 136 and 137 in a direction opposite the resistive heating coils 134 and 135. In one embodiment, the resistive heating coils 134 and 135 are aligned along a first plane, the resistive heating coils 134 and 136 are aligned along a second plane perpendicular to the first plane, resistive heating coils 135 and 137 are aligned along a third plane perpendicular to the first plane, and resistive heating coils 136 and 137 are aligned along a fourth plane parallel to the first plane.

In one embodiment, the gas cell semiconductor chip assembly 100 includes a second semiconductor chip 102 mounted onto an opposite side of the gas cell layer 110 than the first semiconductor chip 101. The second semiconductor chip 102 includes semiconductor layers 151 and a substrate 140. The substrate 140 may be a transparent substrate, such as sapphire. The semiconductor layers 151 include a single-turn circular current loop 153. For purposes of description, the previously-described single-turn circular current loop 133 is referred to as a first single-turn circular current loop 133 and the presently-described single-turn circular current loop 153 is referred to as a second single-turn circular current loop 153. The second single-turn circular current loop 153 surrounds the gas cell 114. The second single-turn circular current loop 153 may have a same shape and size as the first single-turn circular current loop 133.

In embodiments of the invention, the second single-turn circular current loop 153 is spaced apart from the first single-turn circular current loop 133 at a distance D1 (see FIG. 1B) that is the same as the radius R1 (see FIG. 2) of the first and second single-turn circular current loops 133 and 153. This configuration of the first and second single-turn circular current loops 133 and 153 results in a Helmholtz coil, which generates a uniform magnetic field to excite the gas in the gas cell 114.

The semiconductor layers 150 may also include fifth, sixth, seventh and eighth resistive heater coils 154, 155, 156 and 157. The second single-turn circular current loop 153 and the fifth, sixth, seventh and eighth resistive heater coils 154-157 operate in the same manner as the first single-turn circular current loop 133 and the first, second, third and fourth resistive heater coils 134-137, described above, and the operation of these elements is not repeated here.

While FIG. 1A has been provided to describe the layers of a gas cell semiconductor chip assembly 100 according to one embodiment of the invention, it should be noted that the distances and proportions illustrated in FIG. 1A are provided to clearly show features of the gas cell semiconductor chip assembly 100, and may not be proportional to actual distances and proportions of the layers of the gas cell semiconductor chip assembly 100 or the elements in the gas cell semiconductor chip assembly 100.

Figure 1B:
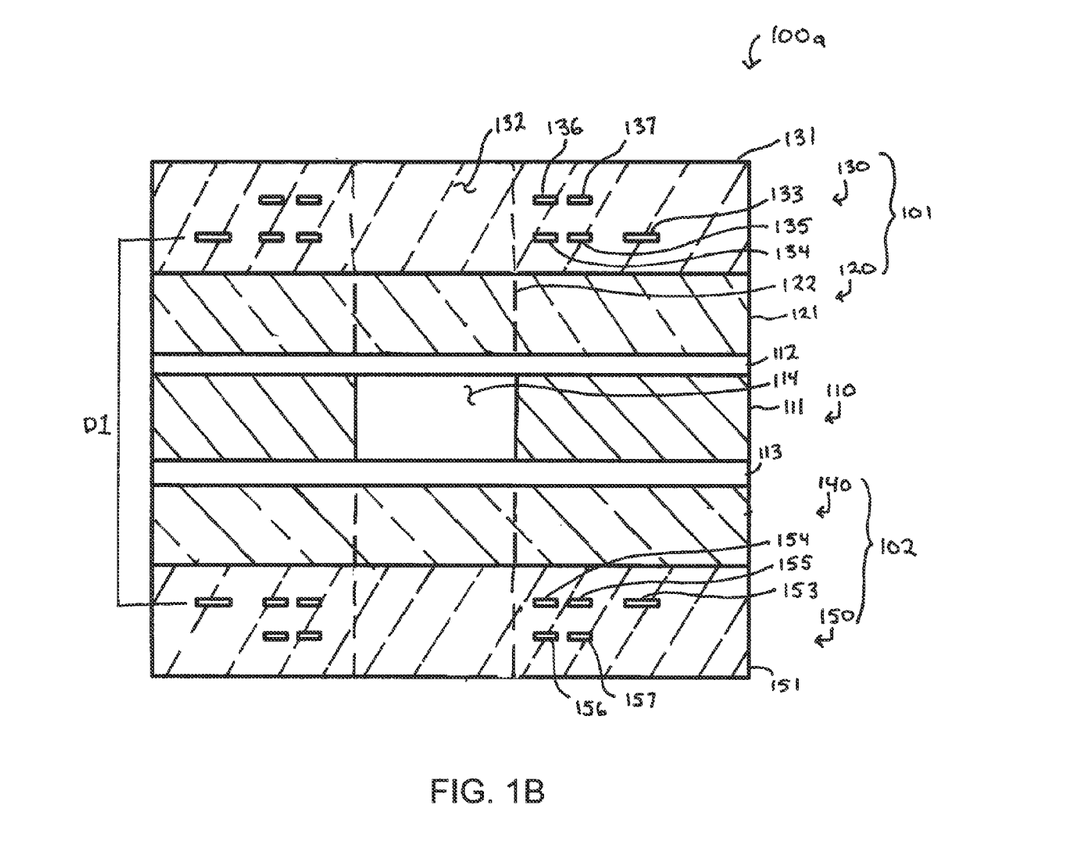
FIG. 1B is a cross-section view of a gas cell semiconductor chip assembly according to another embodiment of the invention.

In addition, while one configuration of layers is illustrated in FIG. 1A, it is understood that embodiments of the invention encompass additional configurations of layers. FIG. 1B illustrates one alternative arrangement of layers of a gas cell semiconductor chip assembly 100a. As illustrated in FIG. 1B, the substrates 120 and 140 may be mounted next to the gas cell layer 110, in contrast to FIG. 1A, in which the semiconductor layers 130 and 150 were illustrated as being mounted next to the gas cell layer 110.

Referring to FIG. 2, the semiconductor layers 130 may further include conductive pads 141-147 and wiring 151-158. The wiring 151-156 is drawn with dashed lines to indicate that the wiring 151-156 may be located on different wiring layers within the semiconductor layers 130 from the single-turn circular current loop 133. The semiconductor layers 130 may include additional elements, such as temperature sensors 161-164 and processing circuitry 165, such as an analog-to-digital converter, or other processing circuitry. The temperature sensors 161-164 may detect the temperature of the heater coils 134 and 135 and may be used to adjust the current to the heater coils 134 and 135 accordingly.

Figure 3:
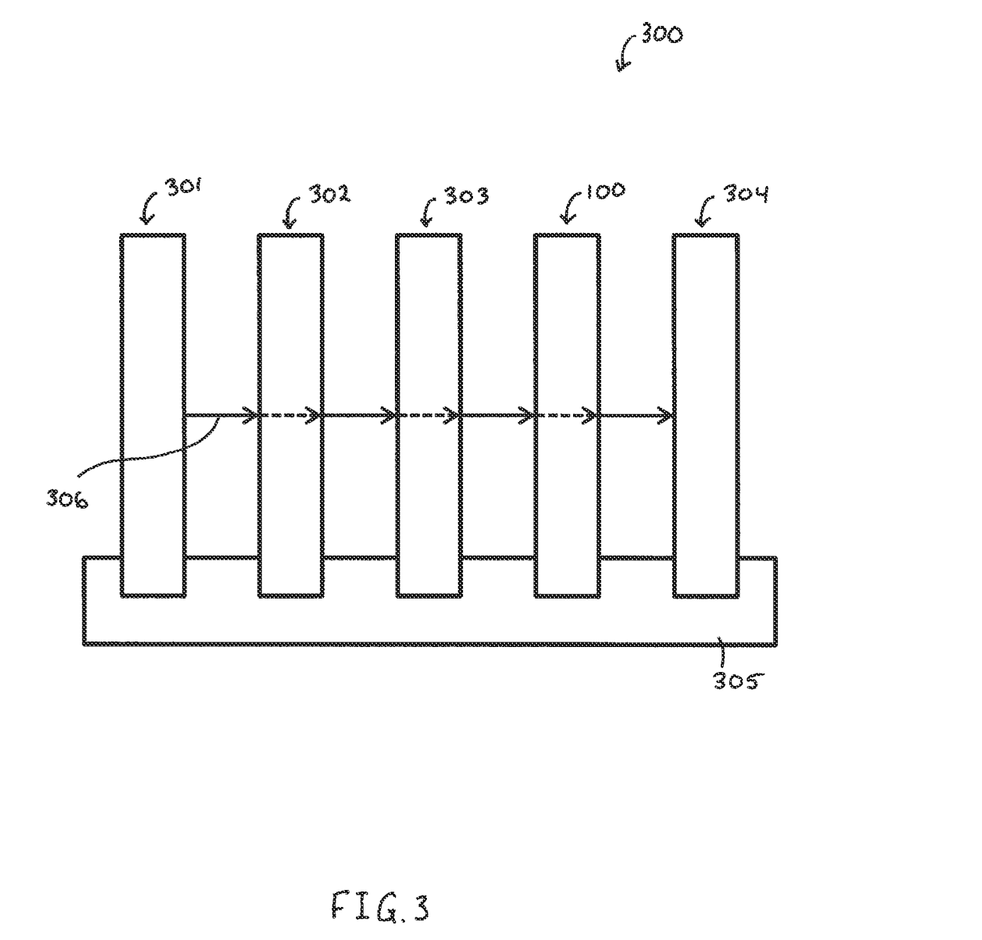
FIG. 3 is a magnetometer assembly according to still another embodiment of the present invention.

FIG. 3 illustrates a magnetometer sensor assembly 300 according to an embodiment of the invention. The sensor assembly 300 includes a light source 301, light detector 304, and gas cell semiconductor assembly 100. The sensor assembly also includes a collimating lens 302 and polarizer 303.

The light source 301, collimating lens 302, polarizer 303, gas cell semiconductor assembly 100 and light detector 304 may be fixed in a mounting structure 305 or in any other housing or structure. In one embodiment, the light source 301 is a vertical-cavity surface-emitting laser (VCSEL) that emits the light 306 as a laser beam. The light 306 is collimated by the collimating lens 302. In one embodiment, the polarizer 303 is a circular polarizer. The light 306 passes through the gas cell or vapor cell of the gas cell semiconductor assembly 100, having the gas heated by the heater coils and excited by the single-turn circular current loop. The excited gas modulates the light 306 output from the gas cell, and the modulated light is detected by the detector 304. The modulated light is affected by a magnetic field surrounding the magnetometer sensor assembly 300, such that the sensed light can be used to measure the characteristics of a magnetic field in the environment around the magnetometer sensor assembly.

An example of one embodiment of the invention utilizing rubidium as the gas in the gas cell or vapor cell is described in further detail below. In one embodiment, a cell containing a suitable gas is illuminated with circularly polarized light with a wavelength that corresponds to resonance with an optical (electronic) transition in the atoms. Under these conditions, atoms are optically pumped into a non-thermal population distribution and the vapor cell becomes largely opaque to the optical beam. If the cell is then subjected to a radio frequency (RF) signal at the Larmor precession frequency, an oscillating population distribution is excited within the atoms, which causes a time-dependent modulation of the optical absorption. By detecting the amplitude change or phase shift of the atomic response, the Larmor frequency can be determined and from that the magnetic field can be deduced. Examples of elements that may be used as gases are metastable helium and alkali metals like cesium, rubidium, and potassium.

In embodiments of the invention, when the gas in the gas cell is excited, the corresponding resonant signal is shifted in phase relative to that of the RF field, and at the Larmor frequency this phase shift amounts to ninety degrees (90°).

Embodiments of the invention encompass a miniature, low-resource, high-precision, high-sensitivity, space-qualified absolute scalar magnetometer. Embodiments utilize a low-power semiconductor laser and a miniature rubidium vapor cell of millimeter dimensions produced using microfabrication processes. The combination of the micro-electro-mechanical system (MEMS) vapor cells and a carefully stabilized semiconductor diode laser allows for a substantial reduction in mass, size, and power dissipation of both clocks and magnetometers. The MEMS vapor cell has been integrated into a magnetic field sensor configured as shown in FIG. 2. In one embodiment, the micro-fabricated rubidium vapor cell is illuminated by light emitted from a vertical-cavity surface-emitting laser (VCSEL) at a nominal wavelength of 795 nm corresponding to a frequency of about 377 THz. The laser light passes through an optics package, where the laser light is collimated and circularly polarized. The resonant response of the atoms is detected using a discrete photodiode.

In one embodiment, miniaturization of the gas cell semiconductor assembly is made possible by the monolithic integration of the vapor gas chamber with heaters, temperature sensors, and Helmholtz coils on a silicon-on-sapphire (SOS) complementary metal-oxide-semiconductor (CMOS) chip. The SOS-CMOS process has a 0.5 micron feature size with 100-nm ultra-thin silicon (UTSi) active layer atop a sapphire substrate. The semiconductor layers of the semiconductor chips may include three metal interconnection layers and one polysilicon layer. The SOS-CMOS process offers a number of advantages over more standard processes, including optical transparency, lower power, higher speed, and radiation hardness. In addition, the UTSi SOS technology provides devices with lower parasitic capacitances than standard CMOS technologies and offers the designer three threshold variations for both p-type and n-type metal-oxide-semiconductor field-effect transistors (MOSFETs), as compared to the two types typically available in most bulk CMOS technologies. The fully-depleted devices with their multiple thresholds, higher normalized transconductance, and reduced parasitics yield high performance analog blocks. However, besides optical transparency the most important consideration of using SOS-CMOS as the transparent face-plates with the build-in heaters is the high thermal conductivity of the sapphire substrate. A high value of thermal conductivity facilitates the uniform heating of the Rb gas in the chamber underneath.

In one embodiment, the SOS-CMOS devices, or semiconductor chips, are mounted to the two faces of the vapor cell perpendicular to the optical axis. The functionality of the SOS-CMOS chips is threefold. First, they host a resistive heater at its center, which heats the vapor cell to it operating temperature of about 100° C. using 0.5 W of power generated by a 10 mA current from a 50 V power supply. To minimize interference with the measurement of the ambient field, the integrated conductor widths and spacing on the 0.5 μm SOS-CMOS chip are on micrometer scales, and near-perfect magnetic compensation may be achieved using two sets of dual square loops arranged in neighboring conducting layers of the chip.

The second function of the SOS-CMOS die is to generate the RF magnetic field necessary to establish the atomic resonance via a single-turn circular coil. To maximize the uniformity of this field across the detection volume, the coils of both SOS-CMOS dies are sized to yield the Helmholtz arrangement, where the coil radius matches their separation prescribed by the thickness of the vapor cell.

Finally, the SOS-CMOS die includes circuits to support temperature measurements and signal conditioning. Even though this design employs SOS-CMOS, embodiments of the invention encompass a silicon substrate appropriately micromachined to allow light to pass through the substrate.

In one embodiment, the sensor is controlled digitally by a field-programmable gate array (FPGA), which generates the signal to excite the rubidium atoms within the vapor cell and measures and processes the resonant response. In addition, the FPGA implements the Larmor frequency tracking loop and provides an interface to a host laptop computer (running MATLAB®, for example, for convenience). Light from the VCSEL is collimated by a lens, circularly polarized, passed through the vapor cell, and finally detected with a silicon photodiode. In one embodiment, a transimpedance amplifier converts the photocurrent to a voltage, which is digitized to 12 bits at 5 Msps and read by the FPGA. This digitized photocurrent signal contains all the sensor information.

To stimulate atomic resonances, the rubidium vapor density must be sufficiently high, and, in most environments, the vapor cell must be heated to increase the vapor pressure and thus the number of atoms in the gaseous state. A field-programmable gate array (FPGA) or other processing circuitry controls the vapor cell temperature by adjusting a pulse-width modulated (PWM) signal provided to a heater boost converter. A higher heater voltage results in more heater current and thus a warmer vapor cell. The temperature of the vapor cell must be hot enough for the rubidium to evaporate, but not so hot as to cause line broadening. This level of control may be achieved, for example, by 8 bits of PWM control and reading the temperature-sensing diodes on the SOS-CMOS die with a voltage-to-frequency converter. In embodiments in which rubidium is used as the gas in the vapor cell, the vapor cell temperature may be regulated to approximately 110° C.

In one embodiment, the atomic resonance of the gas in the gas cell or vapor cell is excited by tuning a vertical-cavity surface-emitting laser (VCSEL) to the D1 line of 87 Rb at 795 nm. The wavelength of the VCSEL is controlled by both current and temperature and is regulated as follows. The FPGA controls a programmable VCSEL drive current source by means of a custom mixed-signal application-specific integrated circuit (ASIC). The VCSEL current is adjusted to provide approximately full-scale digital output when the vapor cell is not heated. With the current drive commanded to this level, the VCSEL temperature is swept slowly to modify the wavelength until the digitized light level reaches a minimum at the center of the 795-nm absorption line. The VCSEL temperature corresponding to the minimum signal is selected as the temperature set point, which is used by the FPGA to command the temperature controller. The temperature set point does not have to be adjusted again unless the VCSEL drive current is changed.

In one embodiment, the FPGA controls a direct digital synthesis (DDS) circuit with 32-bit frequency resolution to infer the ambient magnetic field magnitude to excite the Helmholtz coils hosted on the SOS-CMOS dies. As described earlier, the digitized photodiode signal is modulated at the Helmholtz drive frequency, and exhibits a maximum amplitude and 90° phase shift when the Helmholtz coil drive frequency is equal to the Larmor frequency. This modulated signal is typically quite small, so a digital lock-in amplifier may be implemented in the FPGA. The lock-in may use the sensed DDS drive as an in-phase reference and may perform digital phase shifting to generate a quadrature reference. The lock-in operation narrow band produces in-phase and quadrature signals, which integrate over many cycles of the Larmor frequency.

In one embodiment, continuous magnetic field measurements may be obtained by tracking the Larmor frequency as follows. Initially, the frequency of the current driving the Helmholtz coils may be slowly swept from 500 kHz down to 700 Hz, corresponding to magnetic field magnitudes of 71,428 and 100 nT, respectively, in 100-Hz steps. For each step, the absolute value of the quadrature signal may be compared to an acquisition threshold. When the quadrature absolute value is above threshold, then the Larmor track loop uses the in-phase signal as an error signal to digitally servo the DDS to null the in-phase signal at the Larmor frequency. The Larmor frequency is then determined by the commanded 32-bit DDS command word. The sign of the error signal is determined from the sign of the quadrature signal, since these signals can invert for changes in field geometry. The tracking loop may be set to output 10 samples per second. This permits 100 msec of integration time per sample.

Embodiments of the invention related to a gas cell semiconductor chip assembly that includes a gas cell having an alkali gas stored therein and a first semiconductor chip having a first resistive heating loop at a location corresponding to the gas cell to heat the gas cell and a second resistive heating loop around an outer perimeter of the first resistive heating loop. The second resistive heating loop is configured to cancel a magnetic field of the first resistive heating loop based on a current flowing through the first and second resistive heating loops. Embodiments also relate to a sensor including the gas cell semiconductor chip assembly. Embodiments also include a system for measuring a magnetic field that includes a computer for receiving sensor signals output from the magnetometer sensor and for calculating magnetic field values based on the sensor output signals. Embodiments also include methods for measuring a magnetic field using the gas cell semiconductor chip assembly, including generating opposing currents in the resistive heating loops and generating an RF magnetic field to excite electron spins of the alkali gas.

In one embodiment, the first and second resistive heating loops are configured to have current flow through the second resistive heating loop in a direction opposite the first resistive heating loop.

In one embodiment, the first semiconductor chip includes a third resistive heating loop and a fourth resistive heating loop around an outer perimeter of the third resistive heating loop. The third resistive heating loop is aligned with the fourth resistive heating loop along a first plane and aligned with the first resistive heating loop along a second plane perpendicular to the first plane. The fourth resistive heating loop is aligned with the second resistive heating loop along a third plane perpendicular to the first plane. The fourth resistive heating loop is configured to cancel a magnetic field of the third resistive heating loop and the second resistive heating loop. In addition, the third resistive heating loop is configured to cancel the magnetic field of the first resistive heating loop and the fourth resistive heating loop.

In one embodiment, the first semiconductor chip includes a first single-turn circular current loop surrounding the gas cell and configured to generate a radio frequency (RF) magnetic field to excite a resonance on electron spins of the alkali gas. In another embodiment, the first semiconductor chip includes a second semiconductor chip on an opposite side of the gas cell from the first semiconductor chip, the second semiconductor chip including a second single-turn circular current loop configured to generate a radio frequency (RF) magnetic field to excite a resonance on electron spins of the alkali gas. The first and second single-turn circular current loops may have radii substantially equal to a distance between the first and second single-turn circular current loops to form a Helmholtz coil.

In one embodiment, the first semiconductor chip is a transparent chip, such as a silicon-on-sapphire chip.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments have been chosen and described in order to best explain the principles of the invention and the practical application, and to enable others of ordinary skill in the art to understand the invention for various embodiments with various modifications as are suited to the particular use contemplated While the preferred embodiment to the invention had been described, it will be understood that those skilled in the art, both now and in the future, may make various improvements and enhancements which fall within the scope of the claims which follow.

What is claimed is:

1. A gas cell semiconductor chip assembly, comprising:
a gas cell including an alkali gas stored therein; and
a first semiconductor chip including a first resistive heating loop at a location corresponding to the gas cell to heat the gas cell and a second resistive heating loop disposed around an outer perimeter of the first resistive heating loop, the second resistive heating loop configured to cancel a magnetic field of the first resistive heating loop based on a current flowing through the first and second resistive heating loops.

2. The gas cell semiconductor chip assembly of claim 1, wherein the first and second resistive heating loops are configured to have current flow through the second resistive heating loop in a direction opposite the first resistive heating loop.

3. The gas cell semiconductor chip assembly of claim 1, wherein the first semiconductor chip further comprises a third resistive heating loop and a fourth resistive heating loop disposed around an outer perimeter of the third resistive heating loop, the third resistive heating loop aligned with the fourth resistive heating loop along a first plane and aligned with the first resistive heating loop along a second plane perpendicular to the first plane, the fourth resistive heating loop aligned with the second resistive heating loop along a third plane perpendicular to the first plane,
wherein the fourth resistive heating loop is configured to cancel a magnetic field of the third resistive heating loop and the second resistive heating loop, and
wherein the third resistive heating loop is configured to cancel the magnetic field of the first resistive heating loop and the fourth resistive heating loop.

4. The gas cell semiconductor chip assembly of claim 1, wherein the first semiconductor chip further comprises:
a first single-turn circular current loop surrounding the gas cell and configured to generate a radio frequency (RF) magnetic field to excite a resonance on electron spins of the alkali gas.

5. The gas cell semiconductor chip assembly of claim 4, further comprising:
a second semiconductor chip on an opposite side of the gas cell from the first semiconductor chip, the second semiconductor chip including a second single-turn circular current loop configured to generate a radio frequency (RF) magnetic field to excite a resonance on electron spins of the alkali gas.

6. The gas cell semiconductor chip assembly of claim 5, wherein the first and second single-turn circular current loops have radii substantially equal to a distance between the first and second single-turn circular current loops to form a Helmholtz coil.

7. The gas cell semiconductor chip assembly of claim 1, wherein the first semiconductor chip is a transparent chip.

8. The gas cell semiconductor chip assembly of claim 7, wherein the first semiconductor chip is a silicon-on-sapphire chip.

9. A gas cell sensor assembly, comprising:
a light source;
a light detector to detect light from the light source; and
a gas cell semiconductor chip assembly located between the light source and the light detector, such that the light from the light source passes through a gas cell of the gas cell semiconductor chip assembly prior to being detected by the light detector, the gas cell semiconductor chip assembly comprising:
the gas cell having an alkali gas stored therein; and
a first semiconductor chip including a first resistive heating loop at a location corresponding to the gas cell to heat the gas cell and a second resistive heating loop around an outer perimeter of the first resistive heating loop, the second resistive heating loop configured to cancel a magnetic field of the first resistive heating loop based on a current flowing through the first and second resistive heating loops.

10. The gas cell sensor assembly of claim 9, further comprising:
a collimating lens; and
a circular polarizer, the collimating lens and the circular polarizer located between the light source and the gas cell semiconductor chip assembly and configured to direct the light from the light source to the gas cell.

11. The gas cell sensor assembly of claim 9, wherein the first and second resistive heating loops are configured to have current flow through the second resistive heating loop in a direction opposite the first resistive heating loop.

12. The gas cell sensor assembly of claim 9, wherein the first semiconductor chip further comprises a third resistive heating loop and a fourth resistive heating loop around an outer perimeter of the third resistive heating loop, the third resistive heating loop aligned with the fourth resistive heating loop along a first plane and aligned with the first resistive heating loop along a second plane perpendicular to the first plane, the fourth resistive heating loop aligned with the second resistive heating loop along a third plane perpendicular to the first plane, wherein the fourth resistive heating loop is configured to cancel a magnetic field of the third resistive heating loop and the second resistive heating loop, and wherein the third resistive heating loop is configured to cancel the magnetic field of the first resistive heating loop and the fourth resistive heating loop.

13. The gas cell sensor assembly of claim 9, wherein the first semiconductor chip further comprises:

a first single-turn circular current loop surrounding the gas cell and configured to generate a radio frequency (RF) magnetic field to excite a resonance on electron spins of the alkali gas.

14. The gas cell sensor assembly of claim 13, further comprising an alternating current voltage source connected to the first single-turn circular current loop to generate the RF magnetic field in the first single-turn circular current loop.

15. The gas cell sensor assembly of claim 13, further comprising:

a second semiconductor chip on an opposite side of the gas cell from the first semiconductor chip, the second semiconductor chip including a second single-turn circular current loop configured to generate a radio frequency (RF) magnetic field to excite a resonance on electron spins of the alkali gas.

16. The gas cell sensor assembly of claim 15, wherein the first and second single-turn circular current loops have radii substantially equal to a distance between the first and second single-turn circular current loops to form a Helmholtz coil.

17. The gas cell sensor assembly of claim 16, further comprising a processor configured to measure a magnetic field in an environment around the magnetometer sensor assembly by measuring a modulation of the alkali gas caused by the RF magnetic fields generated by the first and second single-turn circular current loops.

18. The gas cell sensor assembly of claim 9, wherein the first semiconductor chip is a transparent chip.

19. The gas cell sensor assembly of claim 18, wherein the first semiconductor chip is a silicon-on-sapphire chip.

* * * * *